United States Patent [19]
Hasegawa

[11] Patent Number: 6,097,643
[45] Date of Patent: *Aug. 1, 2000

[54] SEMICONDUCTOR STORAGE APPARATUS AND METHOD OF MANUFACTURING OF THE SAME

[75] Inventor: Takehiro Hasegawa, Yokohama, Japan

[73] Assignee: Toshiba Corporation, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/942,346

[22] Filed: Oct. 1, 1997

[30] Foreign Application Priority Data

Oct. 9, 1996 [JP] Japan ..................................... 8-268516

[51] Int. Cl.$^7$ .................................................. G11C 7/00
[52] U.S. Cl. .................... 365/200; 365/230.03; 371/10.3
[58] Field of Search ............................. 365/200, 230.03, 365/63; 371/10.2, 10.3

[56] References Cited

U.S. PATENT DOCUMENTS

| | | | |
|---|---|---|---|
| 5,699,299 | 12/1997 | Kim | 365/200 |
| 5,708,612 | 1/1998 | Abe | 365/200 |
| 5,761,138 | 6/1998 | Lee et al. | 365/200 |

*Primary Examiner*—Son T. Dinh
*Attorney, Agent, or Firm*—Hogan & Hartson LLP

[57] ABSTRACT

A semiconductor storage apparatus having a plurality of memory-cells arranged, forming array which is composed of regular memory-cell blocks and redundant memory-cell blocks, wherein grouping of each of a regular memory-cell blocks each having one DQ line in the form of an overlaid structure is changed in accordance with the addresses of the defective column in a data line, the redundant memory-cell blocks are grouped in accordance with the changed groups of the regular memory-cell blocks, and the grouped redundant memory-cell blocks corresponding to the changed group of the regular memory-cell blocks replaces the regular memory-cell blocks including the defective cell.

9 Claims, 15 Drawing Sheets

SEMICONDUCTOR STORAGE APPARATUS AND METHOD OF MANUFACTURING OF THE SAME

BACKGROUND OF THE INVENTION

The present invention relates to a semiconductor storage apparatus having a plurality of memory-cells arranged, forming array which is composed of regular memory-cell blocks and redundant memory-cell blocks.

More particularly, the invention relates to a semiconductor storage apparatus in which the regular memory-cell blocks are grouped into new regular memory-cell blocks in accordance with the column address of any defective regular memory-cell that has been found.

The grouping of the redundant memory-cell blocks are changed in accordance with the grouped regular memory-cell blocks.

The grouped redundant memory-cell blocks replace the corresponding regular memory-cell blocks including the defective cell and to a manufacturing method therefor.

FIG. 1 is a schematic structural diagram showing an example of a conventional semiconductor storage apparatus.

Referring to FIG. 1, reference numeral 11 represents a row decoder, 12 represents one of 16 memory-cells each of which is composed of 64 columns, 13 represents one of four defect relieving redundant memory-cells each of which is composed of four columns, 14 represents one of two second data lines (2DQ) formed in a sense amplifier region, 15 represents a read amplifier and 16 represents the sense amplifier region. I/O terminals 0 to 3 are connected to the read amplifier 15.

FIG. 2 is a circuit diagram showing a portion of the semiconductor storage apparatus shown in FIG. 1.

The second data line (2DQ) 14 is, in each pair (DQ), connected to a sense amplifier 18 through a FET 17. The sense amplifier 18 is connected to a memory-cell section 20 through a first data line 19. The memory-cell section 20 is connected to a word line 21. The gate of the FET 17 is connected to a column selection line 22. Reference numeral 23 represents a memory-cell array region.

A circuit which pre-changes the first data line is omitted.

FIG. 3 is a circuit diagram showing the memory-cell section 20 shown in FIG. 2.

The first data line 19 is connected to a memory-cell 25 of a capacitor storage device through a transfer gate, for example, a FET 24. The gate of the FET 24 is connected to the word line 21.

In the conventional memory shown in FIGS. 1 to 3 having the structure for reading data from the memory-cell 25 to the outside and formed such that the second data lines 14 are formed in the sense amplifier region 16 in parallel to the word line 21, the column selection line 22 is formed in parallel to the first data line 19 in the memory-cell array region 23. Thus, four bits of memory-cell data amplified by the sense amplifier 18 are output to the second data line 14 so that data is read to the outside.

However, when a large quantity of data is read from one memory-cell array, for example, when 128-bit data is read from the memory-cell array, the above-mentioned structure of the data lines, having the necessity of causing 128 pairs of the second data lines 14 to pass through the sense amplifier region 16, suffers from a problem in that the area of the sense amplifier region 16 is enlarged excessively.

FIG. 4 is a schematic diagram showing the structure of a conventional semiconductor storage apparatus arranged to be capable of solving the above-mentioned problem.

Referring to FIG. 4, reference numeral 31 represents a row decoder, 32 represents one of 16 memory-cells each of which is composed of 64 columns, 33 represents one of two defect relieving redundant memory-cells each of which is composed of 8 columns, 34 represents 16 data lines (8DQ) formed into 8 pairs to run parallel to the first data lines 39 shown in FIG. 5, 35 represents one of a group of four column selection lines formed into two pairs in the sense amplifier region 16 to run parallel to the word line and 36 represents redundant data line, in the memory-cell array region 23, formed into a pair to run parallel to the first data line 19.

FIG. 5 is a circuit diagram showing a portion of the semiconductor storage apparatus shown in FIG. 4. FIG. 6 is an enlarged circuit diagram showing the portion Z shown in FIG. 5.

The pairs of the second data lines (8DQ) 34 are connected to 8 sense amplifiers 38 through the corresponding FETs 37. Moreover, each of the sense amplifiers 38 is connected to the memory-cell section 40 through the first data line 39.

The memory-cell section 40 is connected to a word line 41, while the gates of FETs 37 are connected to 8 corresponding column selection lines 35. The memory-cell section 40 has a structure similar to that shown in FIG. 3.

In an overlaid-DQ structure semiconductor storage apparatus, as shown in FIGS. 4 and 5, having the second data lines 34 formed in parallel to the first data lines 39 on the memory-cell array thereof, 8 column selection lines 35 select memory-cells in one column unit from memory-cells in 8 column units to read data to one pair of the second data lines (DQ). Therefore, 8 pairs of the second data lines (8DQ) 34 are required to read memory-cells in 64 column units.

Therefore, memory-cells in 128 column units can simultaneously be selected by 16 sets of 8 pairs of the second data lines (8DQ) 34. As described above, memory-cells in 128 column units can simultaneously be selected by a structure in which 8 column selection lines 35 are formed in the sense amplifier region 16 and 16 sets of 8 pairs of the second data lines 34 are formed in the memory-cell array region 23. As a result, a large quantity of data can simultaneously be read without considerably enlargement of the areas of the memory-cell array region 23 and the sense amplifier region 16.

However, the above-mentioned structure encounters a problem in that the defect relieving efficiency in the column direction deteriorates. Providing that the defect relieving redundant memory-cell have 16 column units, the degree of freedom to relieve defects of the semiconductor storage apparatus shown in FIG. 1 and that shown in FIG. 4 are subjected to a comparison. The defect relieving redundant memory-cells of the semiconductor storage apparatus shown in FIG. 1 are able to relieve four sets of four column units (which are units for one column selection line), that is, four defects in the direction of column. However, the defect relieving redundant memory-cells of the semiconductor storage apparatus shown in FIG. 4 are able to relieve only two sets of 8 column units (which are units for one pair of the second data lines), that is, only two defects in the direction of column.

This means a fact that the defect relieving efficiency is made to be substantially halved. If four defects in the direction of column are required to be relieved, four sets of the defect relieving redundant memory-cells 33 in 8 column units must be provided. In this case, the number of the defect relieving redundant memory-cells are made to be two times. Thus, the area of the chip is enlarged by several percents.

Referring to FIG. 7, the same elements as those shown in FIG. 4 are given the same reference numerals and the structures of the same elements are omitted from description.

As described above, the overlaid-DQ structure semiconductor storage apparatus, which is capable of reading a large quantity of data without the necessity of enlarging the area of the chip, has the problem in that the defect relieving efficiency in the direction of column or the problem in that the area is enlarged if the same defect relieving efficiency is required to be realized.

BRIEF SUMMARY OF THE INVENTION

In view of the foregoing, an object of the present invention is to provide a semiconductor storage apparatus capable of improving the defect relieving efficiency in the direction of column without enlargement of the area of the chip and a manufacturing method therefor.

To achieve the above-mentioned object, according to one aspect of the present invention, there is provided a semiconductor storage apparatus comprising:

a plurality of memory-cells arranged, forming array which is composed of regular memory-cell blocks and redundant memory-cell blocks;

a DQ line shared by physically adjacent columns for each of a plurality of memory-cells in the regular memory-cell blocks and the redundant memory-cell blocks, the plural memory-cell groups being grouped into at least two groups sharing the DQ line;

means for storing the addresses of columns in which the defects have been generated in the regular memory-cell blocks when at least two defects were detected in data lines of a plurality of regular memory-cell blocks;

means for grouping the redundant memory-cell blocks into groups in accordance with the changed groups corresponding to the addresses of the defective column in the data lines in the regular memory-cell blocks which share the DQ lines; and means for substituting the changed grouping portions of the redundant memory-cell blocks for the corresponding regular memory-cell blocks in which includes the defect.

According to another aspect of the present invention, there is provided a method of manufacturing a semiconductor storage apparatus comprising the steps: of preparing a plurality of memory-cells having a regular memory-cell block group and a defect relieving redundant memory-cell block group and disposed in an array configuration, a DQ line shared by a plurality of memory-cells in the regular memory-cell block group and a plurality of memory-cells in the redundant memory-cell block group, the plural memory-cell blocks in the regular memory-cell block group being divided into at least two memory-cell groups sharing the one DQ line;

detecting at least two defects generated in data lines of a plurality of memory-cell blocks of the regular memory-cell block group to confirm groups in the grouped memory-cell block to which the defects respectively belong;

changing grouping of the memory-cell group in accordance with the addresses of defective columns in the memory-cell block in which the defects have been generated in at least two memory-cell blocks in the regular memory-cell block group which respectively share the DQ line;

grouping the plurality of memory-cell blocks of the defect relieving redundant memory-cell block group in accordance with changed grouping performed in the step of changing grouping of the plurality of memory-cell blocks in the regular memory-cell block group; and substituting grouped defect relieving unit memory-cell groups in the defect relieving redundant memory-cell block groups for the group in the regular memory-cell block group in which changed grouping has been performed and which includes the defects.

The semiconductor storage apparatus and the method of manufacturing the semiconductor storage apparatus each having the above-mentioned structure arranged such that grouping of memory-cell block in the regular memory-cell block group sharing the DQ line is changed in accordance with the addresses of the defective columns, the defect relieving redundant memory-cell block group is grouped in accordance with the changed grouping of the regular memory-cell block, and the grouped portion is substituted for the memory-cell group in the regular memory-cell block group in which changed grouping has been performed and which includes the defects. Thus, a large quantity of data can be read without enlargement of the chip. Moreover, the defect relieving efficiency in the columnar direction can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the drawings.

Figure 8:
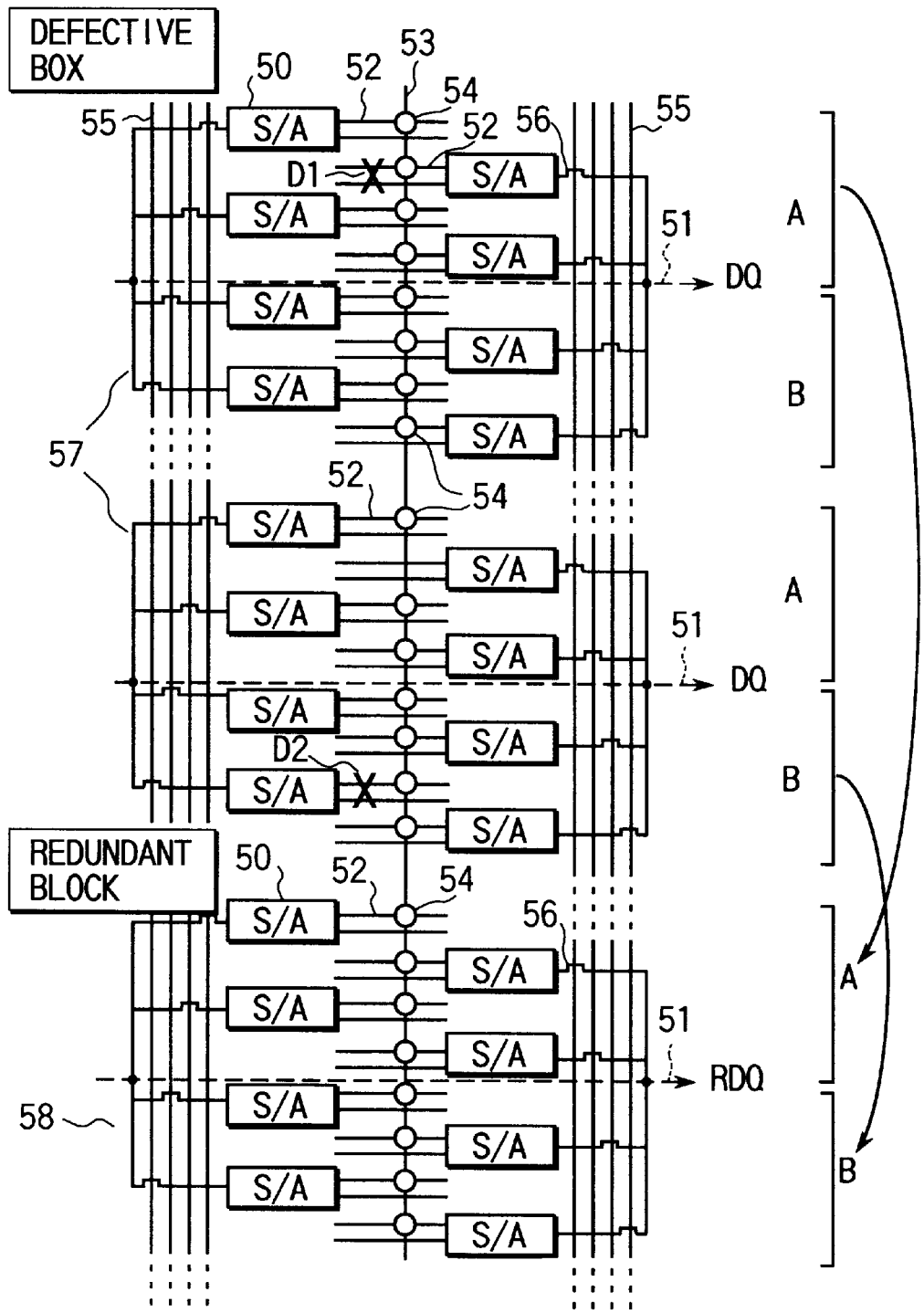
FIG. 8 is a block diagram showing an example of the structure of a semiconductor storage apparatus according to the present invention.

FIG. 8 is a block diagram showing an example of the structure of a semiconductor storage apparatus according to the present invention and having an overlaid structure in which second data lines (DQ and RDQ) 51 are formed in the same direction as the first data lines 52 and the foregoing data lines 51 and 52 are formed on a memory-cell array.

A memory-cell section 54 is formed at the inter-section between the first data line 52 and the word line (WL) 53. The memory-cell section 54 is formed similarly to that shown in FIG. 3. Thus, the memory-cell is connected to the first data line 52 through a FET, which is an example of a transfer gate which is controlled by the word line 53.

In the semiconductor storage apparatus, a plurality of memory-cells are disposed into an array configuration.

The first data lines 52 are connected to second data lines (DQ and RDQ) 51 through a transfer gate 56, for example, a FET, which is controlled by a column selection line 55 through a sense amplifier (S/A) 50. In this case, the pair of the second data lines (DQ and RDQ) 51 are shared by 8 columns which are physically adjacent to each other.

The plurality of the memory-cells disposed in the array configuration is formed by a group composed of regular memory-cell blocks 57 and a group composed of defect relieving redundant memory-cell blocks 58.

The plural memory-cell blocks in the regular memory-cell block group are grouped into at least two memory-cell groups A and B which respectively share one DQ line 51.

On the other hand, the plural memory-cell blocks in the group composed of the defect relieving redundant memory-cell blocks 58 are grouped into at least two memory-cell groups A and B which correspond to the memory-cell groups A and B obtained by grouping the plural memory-cell blocks in the regular memory-cell block group and which share one RDQ line 51.

If defects D1 and D2 respectively are detected in a plurality of, for example, two memory-cell blocks 57 among the regular memory-cell block group shown in FIG. 8 in a case where the defect D1 belongs to the defective memory-cell group in the first memory-cell block A and the defect D2 belongs to the memory-cell group B in the second memory-cell block, the group A formed by grouping the redundant memory-cell blocks 58 is substituted for the first memory-cell block 57 which includes the defect D1 and which is the defective block.

On the other hand, the group B formed by grouping the redundant memory-cell blocks 58 is substituted for the second memory-cell block 57 which includes the defect D2 and which is the defective block.

Figure 9:
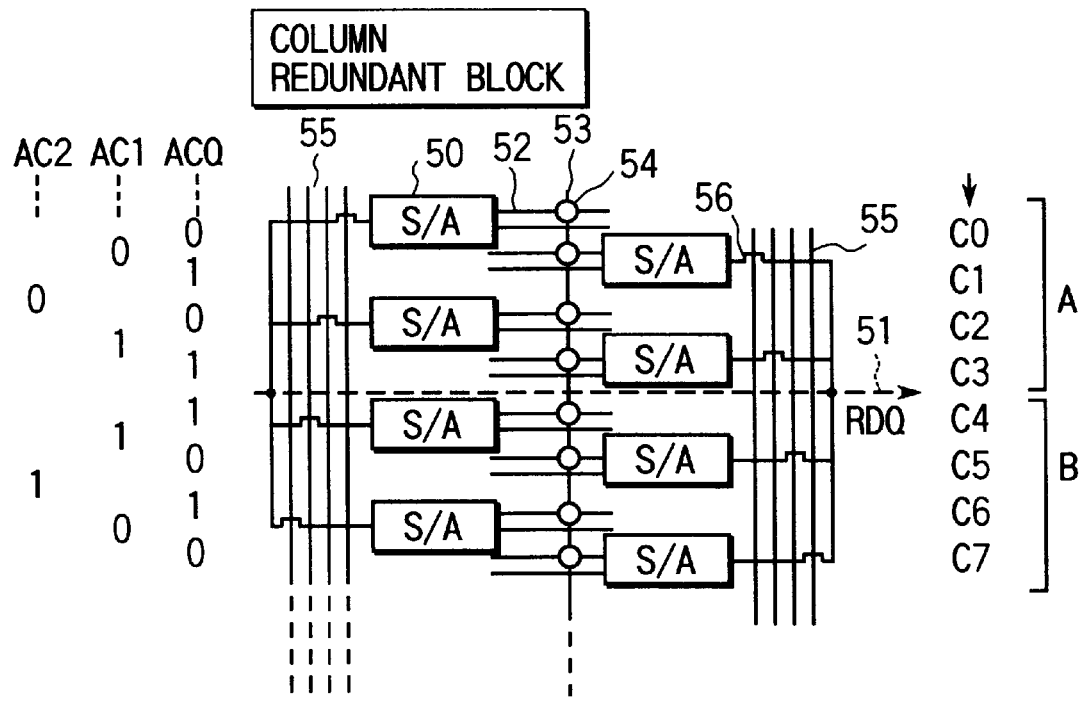
FIG. 9 is a diagram showing column addresses of the defect relieving redundant memory-cell blocks of the semiconductor storage apparatus according to the present invention.

FIG. 9 is a diagram showing an example of column addresses in the defect relieving redundant memory-cell shown in FIG. 8.

Assuming that the numbers of the columns in the defect relieving redundant memory-cell block which are physically adjacent to one another are C0, C1, C2, C3, C4, C5, C6 and C7, the group A has columns given numbers C0 to C3 and the group B given numbers C4 to C7 in such a manner that the line DQ is shared.

At this time, column address AC0 is determined to be "0", "1", "0", "1", "1", "0", "1" and "0" to correspond to column numbers "C0", "C1", "C2", "C3", "C4", "C5", "C6" and "C7". Column address AC1 is determined to be "0", "1", "1" and "0" to correspond to column numbers "C0, C1", "C2, C3", "C4, C5" and "C6, C7". Column address AC2 is determined to be "0" and "1" to correspond to column numbers "C0, C1, C2 and C3" and "C4, C5, C6 and C7".

Figure 10B:
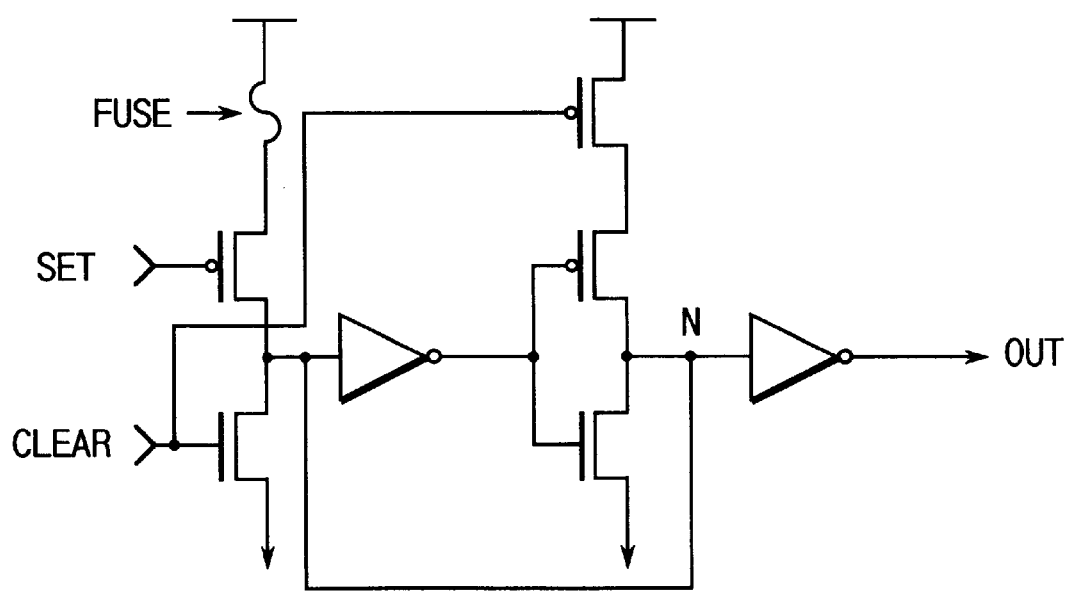
FIG. 10B is a circuit which detects whether a fuse is turned off.
Figure 10A:
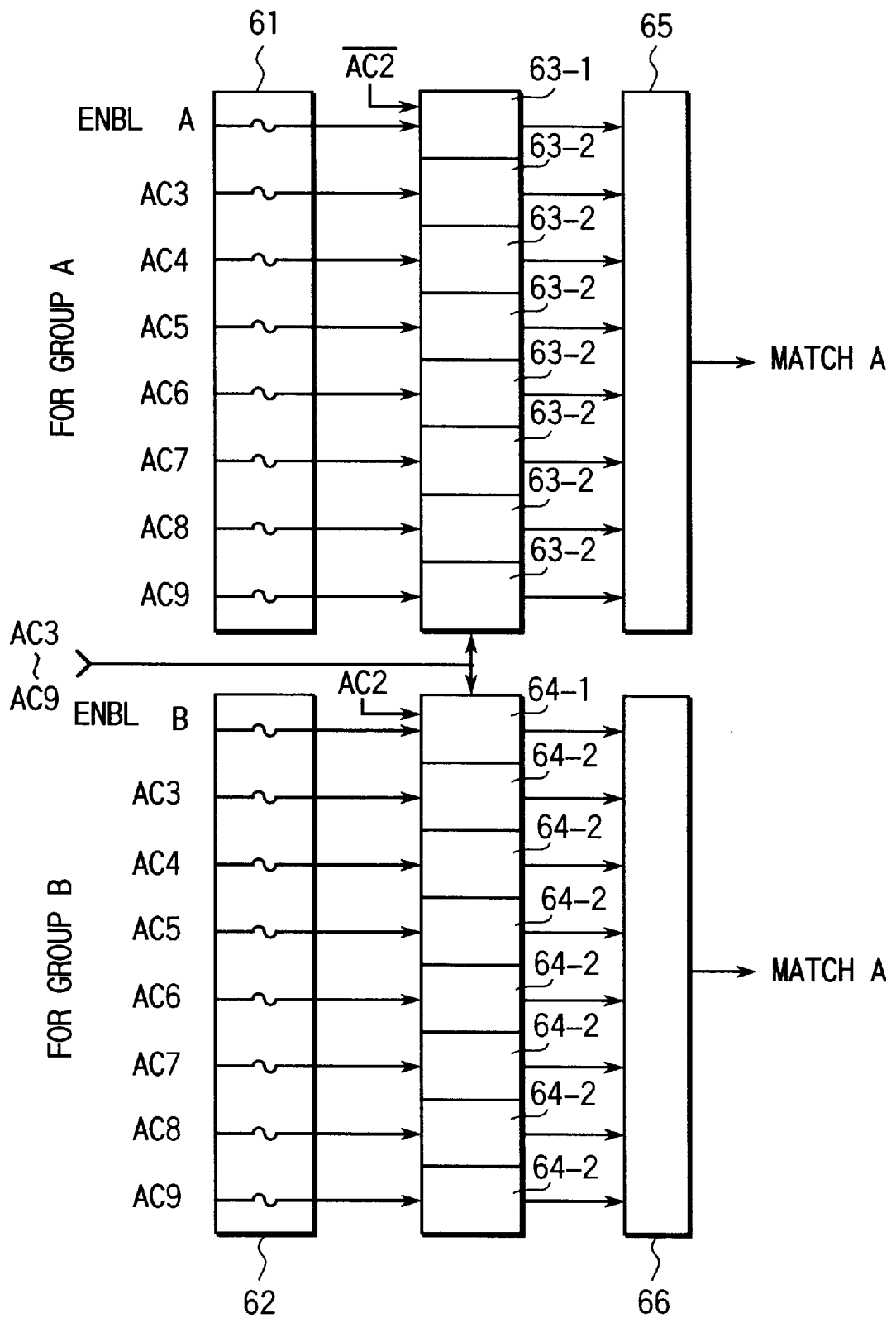
FIG. 10A is a block diagram showing a control circuit for substituting the defect relieving redundant memory-cell block for a defective regular memory-cell block of the semiconductor storage apparatus according to the present invention.

FIG. 10A is a block diagram showing a control circuit for substituting the defect relieving redundant memory-cell block for a defective regular memory-cell block in the semiconductor storage apparatus according to the present invention.

The column address of the defect D1 generated in the regular memory-cell block 57 is stored in a fuse block 61 for the group A. The column address of the defect D2 generated in the regular memory-cell block 57 is stored in the fuse block 62 for the group B.

The fuse blocks 61 and 62 respectively are provided with enable fuse devices ENBL A and ENBL B for indicating substitution of the defect relieving redundant memory-cells and fuse devices for storing the column address AC3 to AC9 in the defective block.

Each of the fuse devices ENBL A and B and the fuse devices AC3 to AC9 outputs "0" (low voltage level "L") if the fuse is not turned off and outputs "1" (high voltage level "H") if the fuse is turned off. FIG. 10B shows a circuit which detects whether a fuse is turned off. After a power source is turned on, a CLEAR signal causes a "H" pulse to generate. Then, it is stored whether a fuse is turned off or not at a node N in receipt of a "L" pulse generated by a SET signal. That is, to store the column address of the defect D1 generated in the regular memory-cell block 57 in the fuse block 61 for the group A, the enable fuse device ENBL A for the group A is turned off and the fuse device AC3 to AC9 for the group A are not turned off or turned off. Thus, the column address of the defect D1 generated in the regular memory-cell block 57 is stored.

To store the column address of the defect D2 generated in the regular memory-cell block 57 in the fuse block 62 for the group B, the enable fuse device ENBL B for the group B is turned off and the fuse device AC3 to AC9 for the group B are not turned off or turned off. Thus, the column address of the defect D2 generated in the regular memory-cell block 57 is stored.

The outputs from the fuse devices ENBL A, ENBL B and AC3 to AC9 of the fuse blocks 61 and 62 are received by corresponding array bit comparators 63-1, 63-2, 64-1 and 64-2. The array bit comparator 63-1 is supplied with column address $\overline{AC2}$ (inversion signal of AC2) and ENBL A.

The comparators 63-2 are supplied with outputs from corresponding fuse devices AC3 to AC9 of the fuse block 61.

The address bit comparator 64-1 is supplied with the column address signal AC2 and ENBL B. The comparators 64-2 are supplied with outputs from the corresponding fuse devices AC3 to AC9 of the fuse block 62.

The comparators 63-2 and 64-2 are supplied with the corresponding column addresses AC3 to AC9.

The address bit comparators 63-2 and 64-2 output "H" only when both of the inputs from the fuse devices AC3 to AC9 and inputs from the column addresses AC3 to AC9 are "H" and only when both of the inputs are "L". In the other case, "L" is output. The address bit comparators 63-2 and 64-2 may be realized by Exclusive NOR circuits. In the address bit comparator 63-1, the output from the enable fuse device ENBL A for the group A and the column address $\overline{AC2}$ are subjected to a comparison. When the output from the enable fuse device ENBL A is "H" ("H" is output when the enable fuse device ENBL A has been turned off) and the column address $\overline{AC2}$ is "H" (when AC2 is 0, $\overline{AC2}$ is "H"), "H" is output. The address bit comparator 63-1 may be an AND circuit.

In the address bit comparator 63-2, the outputs from the fuse devices AC3 to AC9 for the group A and the column addresses AC3 to AC9 are correspondingly subjected to comparisons.

In the address bit comparator 64-1, the output from the enable fuse device ENBL B for the group B ("H" is output when the enable fuse device ENBL B has been turned off) and the column address AC2 (when AC2 is 1, the level is made to be "H") are subjected to a comparison. When the enable fuse device ENBL B is "H" and the column address AC2 is "H", "H" is output.

In the address bit comparator 64-2, the outputs from the fuse devices AC3 to AC9 for the group B and the column addresses AC3 to AC9 are correspondingly subjected to comparisons. The outputs from the address bit comparators 63-1 and 63-2 are supplied to a logical product circuit 65. The logical product circuit 65 outputs Match A when all of the inputs from the address bit comparators 63-1 and 63-2 are "H".

When Match A has been output, the corresponding group of the memory-cell relieving unit of the redundant block can be substituted for the column address of the defect D1 generated in the regular memory-cell block 57.

The outputs from the address bit comparators 64-1 and 64-2 are supplied to a logical product circuit 66. The logical product circuit 66 outputs Match B when all of the inputs from the address bit comparators 64-1 and 64-2 are "H".

When Match B has been output, the corresponding group of the memory-cell relieving unit of the redundant block can be substituted for the column address of the defect D2 generated in the regular memory-cell block 57.

As described above, the structure according to this embodiment is formed such that the defect relieving redundant memory-cell units are divided into a plurality of groups A and B; and the control circuit is provided which independently substitute groups in the defect relieving redundant memory-cell units for the defects in the regular memory-cell region. As a result, even if a plurality of defects are generated in the second data line (DQ) independently from the regular memory-cell block, the group A which is one of the groups of the defect relieving redundant memory-cells can be substituted for either of the defects. Moreover, the group B can be substituted for the other defect.

Therefore, the apparent number of the defect relieving redundant memory-cells can be doubled. As a result, one defect relieving redundant memory-cell block 58 is able to substitute the defects in different columns, as shown in FIG. 8.

Figure 11:
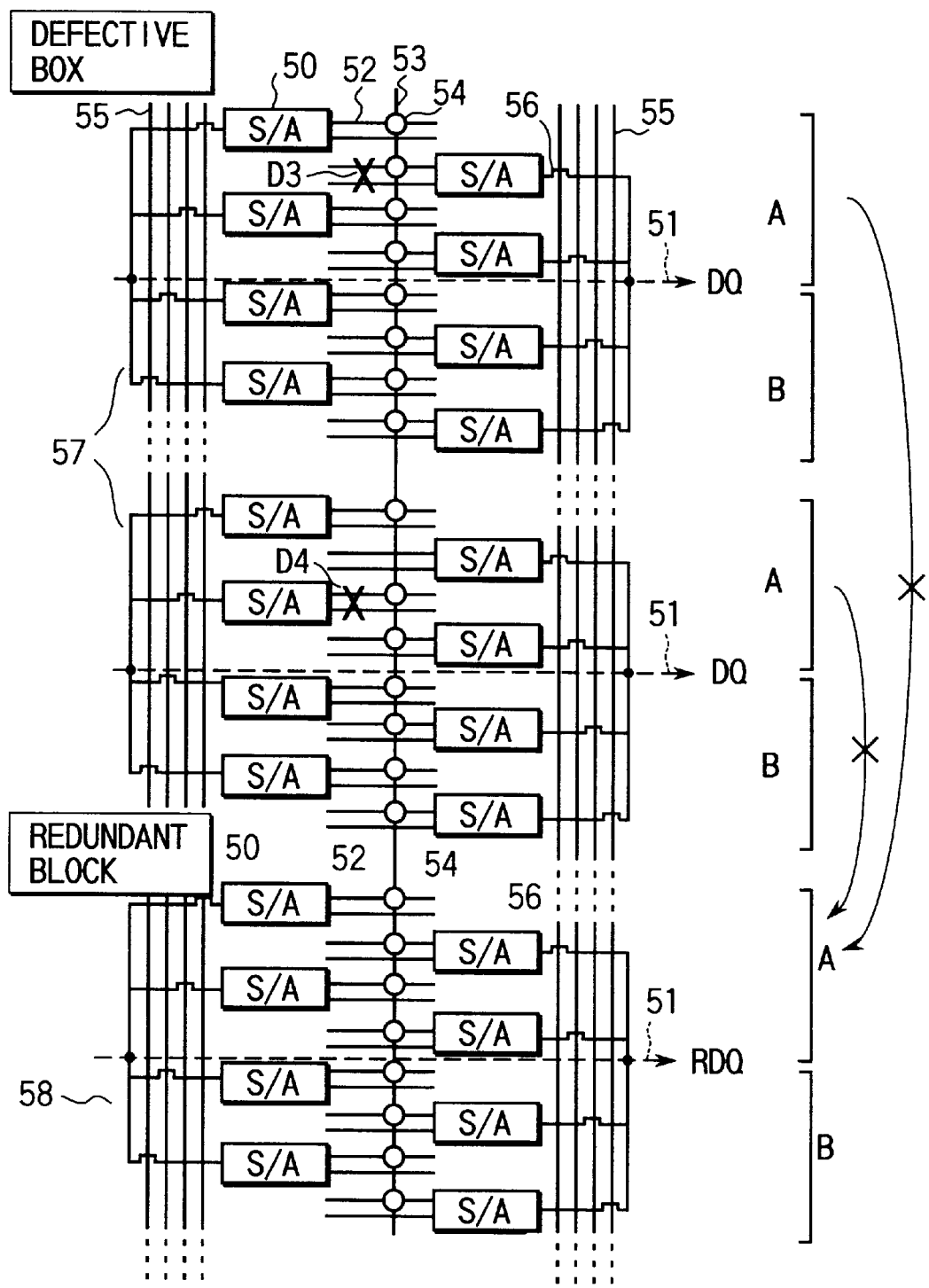
FIG. 11 is a diagram showing an operation for substituting the defect relieving redundant memory-cell block in a case where each defect has been generated in a region belonging to group A of the group A and group B formed by grouping a plurality of regular memory-cell blocks of the semiconductor storage apparatus according to the present invention.

If defects D3 and D4 are generated in the second data line (DQ) 51 independently from the regular memory-cell block 57 as shown in FIG. 11 such that the two defects D3 and D4 are generated in a region belonging to the group A of the regular memory-cell block 57, the group A of the one redundant column relieving unit for dividing the defect relieving redundant memory-cell block 58 into the group A and group B cannot substitute the two defects D3 and D4.

The reason for this is that the region to be divided into groups are fixedly determined to be the groups A and B. If the division is enabled to be performed arbitrarily by using a fuse device, the above-mentioned problem can be overcome. The structure capable of realizing this will now be described.

Figure 12:
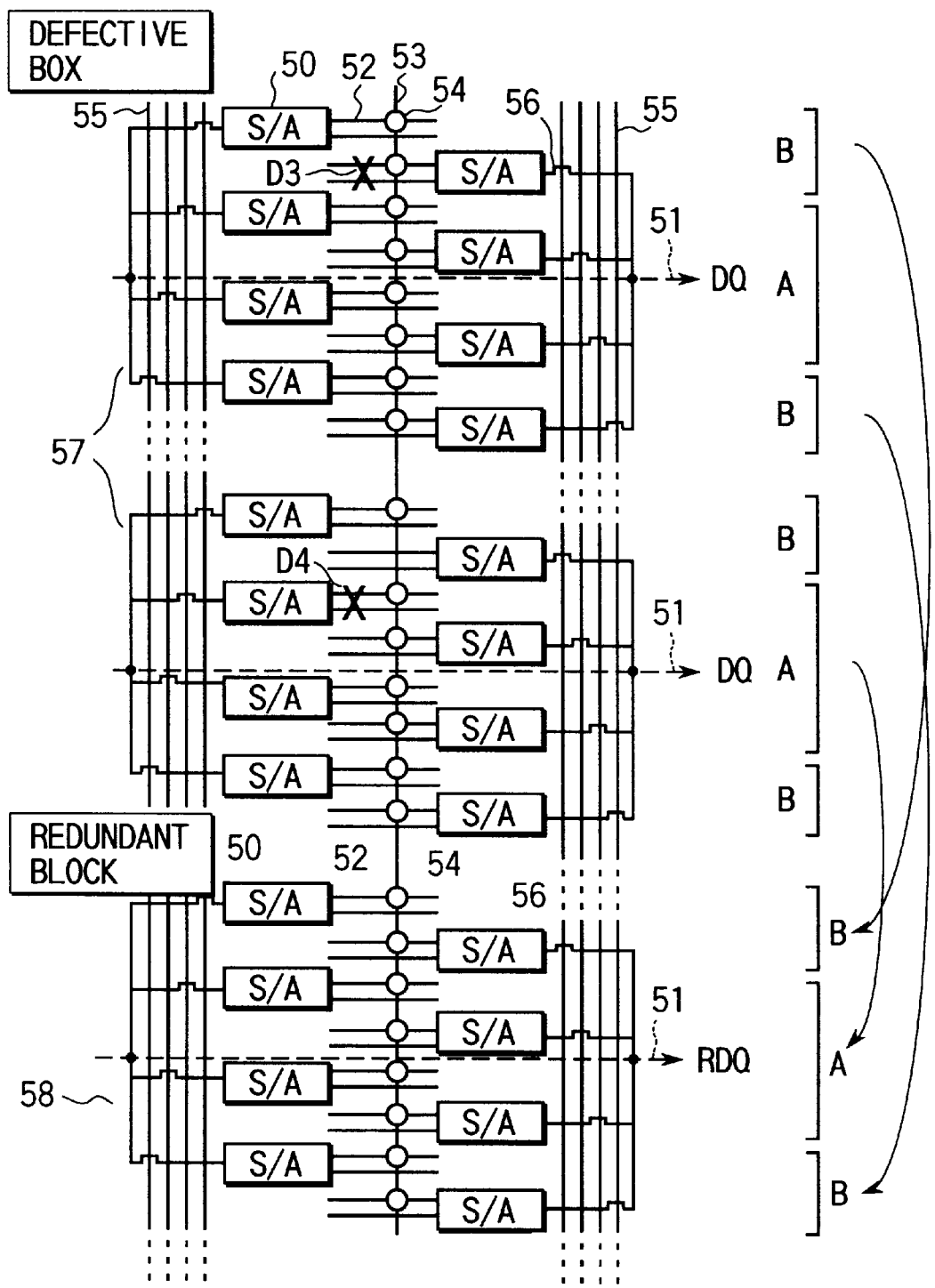
FIG. 12 is a diagram showing an operation for substituting the memory-cell group of the defect relieving unit of the semiconductor storage apparatus according to the present invention for the group in the regular memory-cell block group in which changed grouping has been performed and which includes the defects.

FIG. 12 is a diagram showing another embodiment of the present invention.

That is, second data lines (DQ and RDQ) 51 are formed in the same direction as the first data lines 52 and the foregoing data lines 51 and 52 are formed on a memory-cell array so that a semiconductor storage apparatus in the form of an overlaid structure is formed. A memory-cell section 54 is formed at the intersection between the first data line 52 and the word line (WL) 53.

Figure 1:
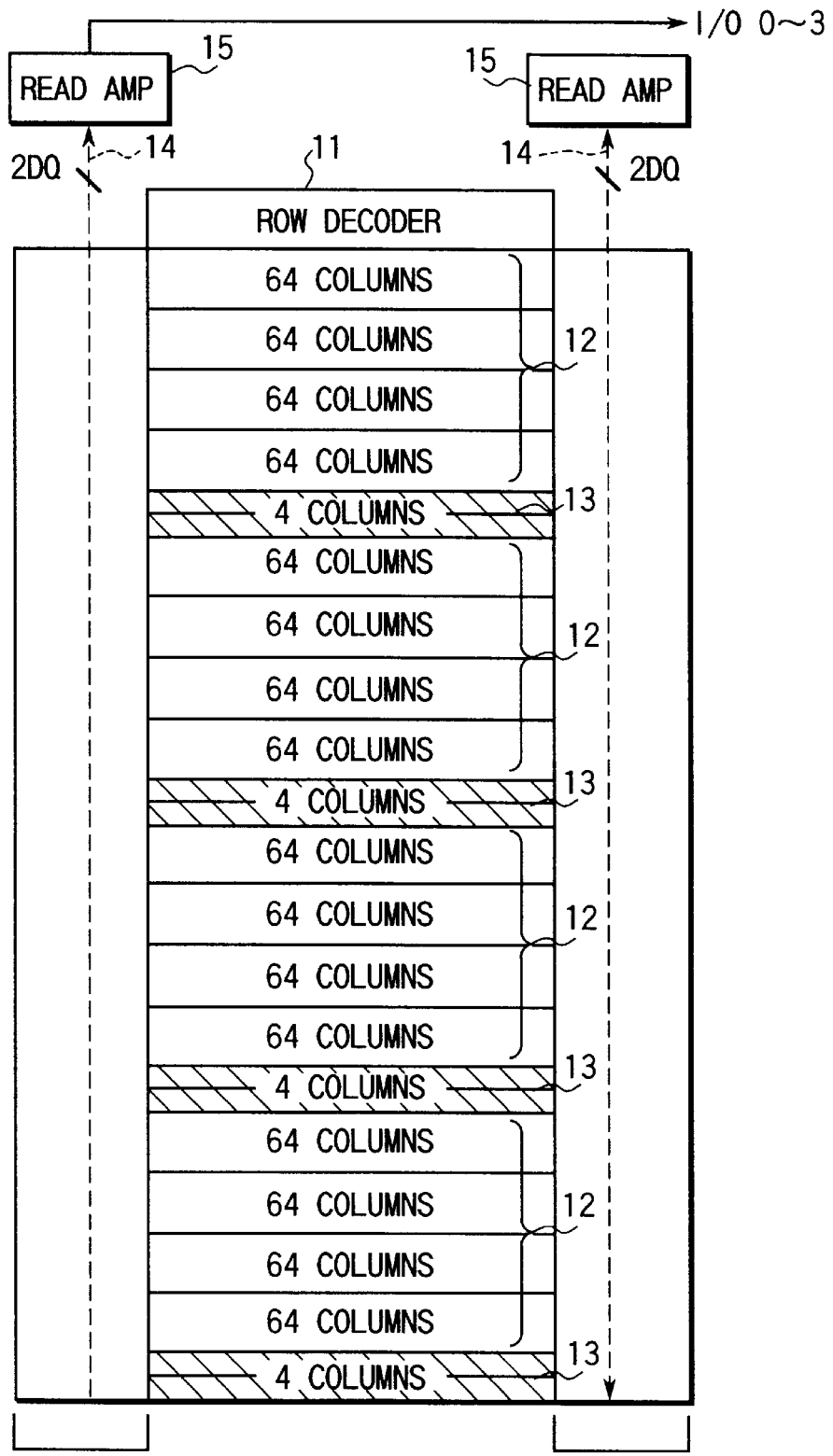
FIG. 1 is a block diagram showing the structure of a conventional semiconductor storage apparatus.
Figure 2:
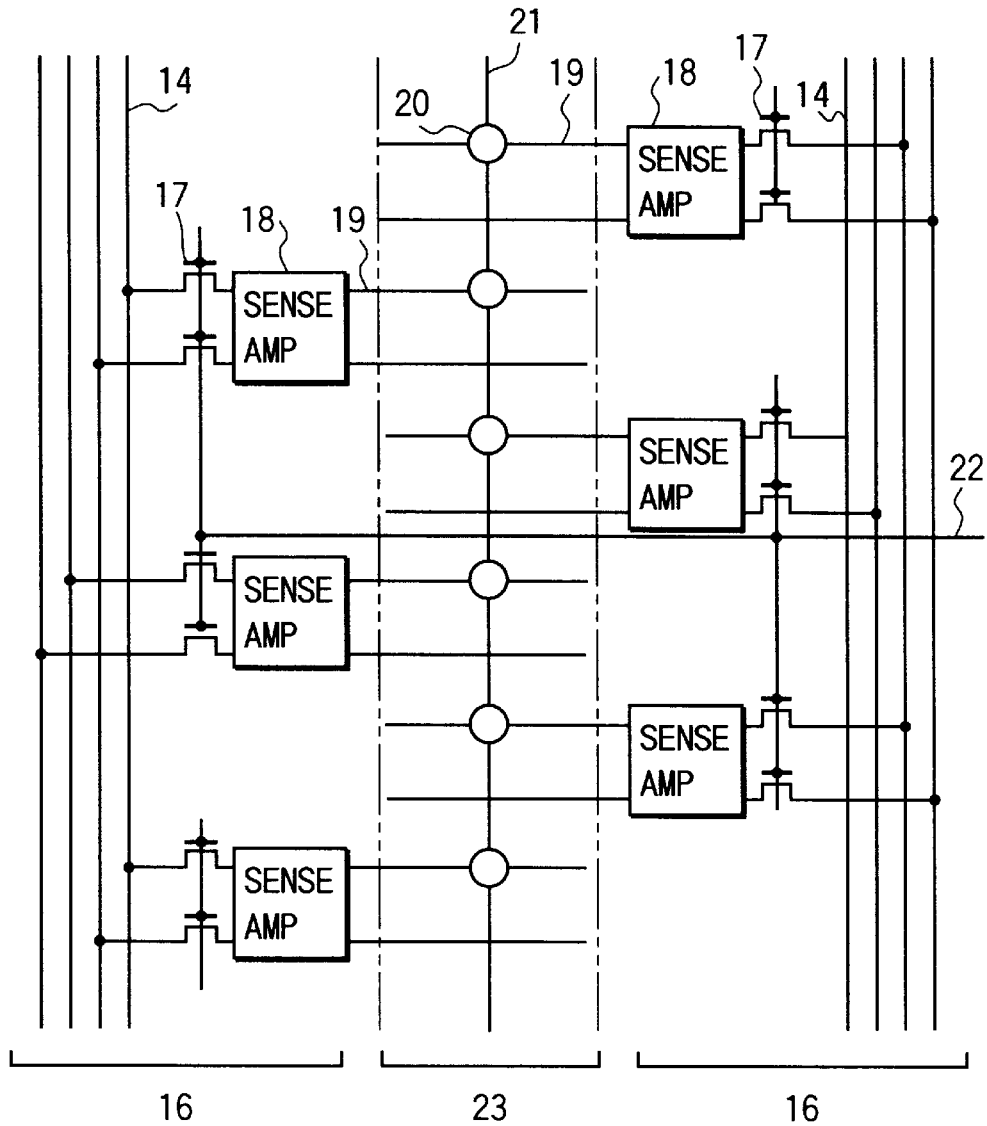
FIG. 2 is a circuit diagram showing a portion of the semiconductor storage apparatus shown in FIG. 1.
Figure 3:
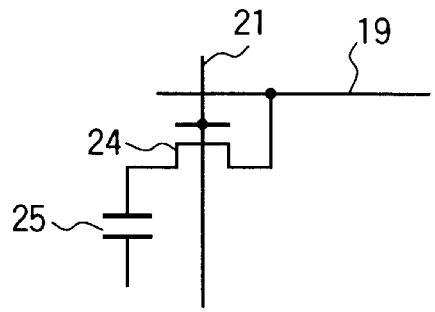
FIG. 3 is a specific circuit diagram showing the memory-cell section shown in FIG. 2.
Figure 4:
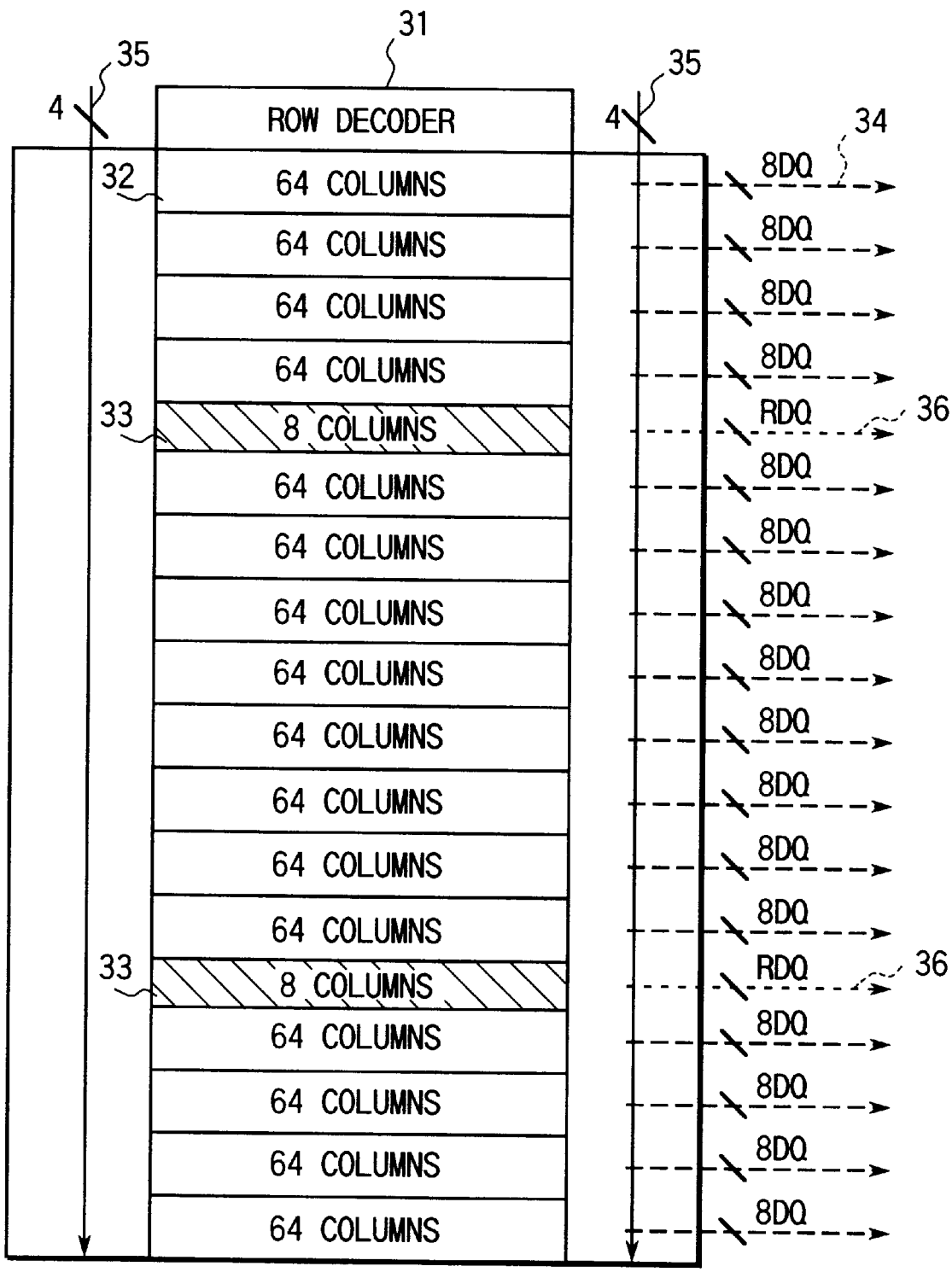
FIG. 4 is a block diagram showing another example of the structure of a conventional semiconductor storage apparatus.
Figure 5:
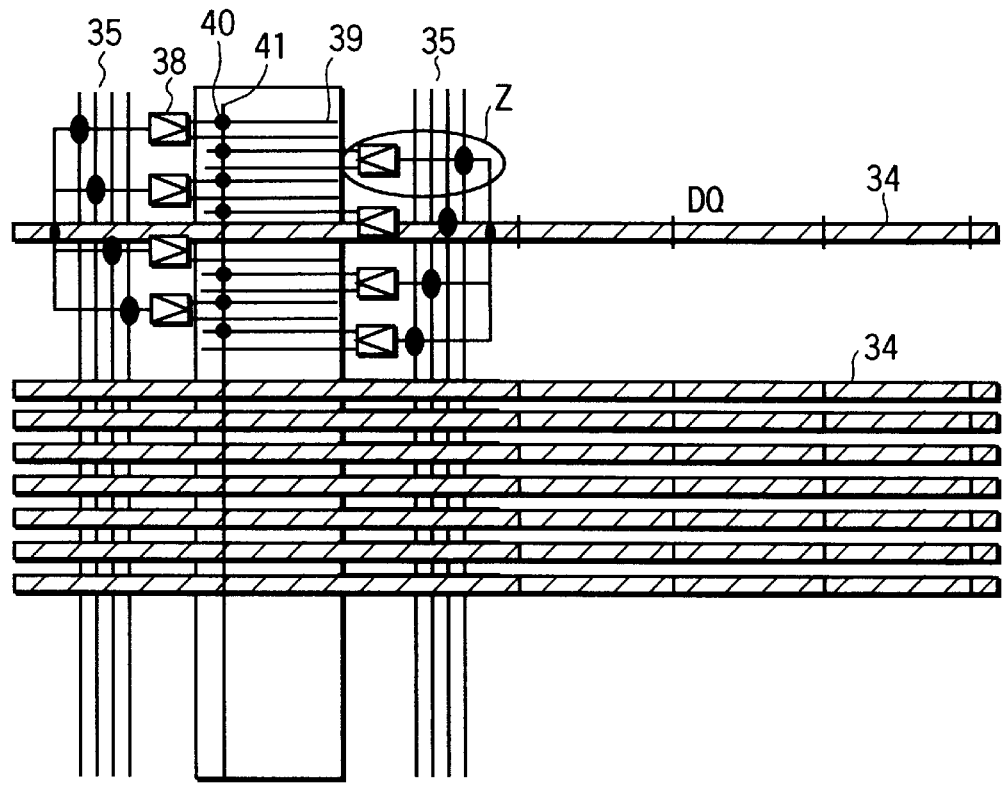
FIG. 5 is a circuit diagram showing a portion of the semiconductor storage apparatus shown in FIG. 4.
Figure 6:
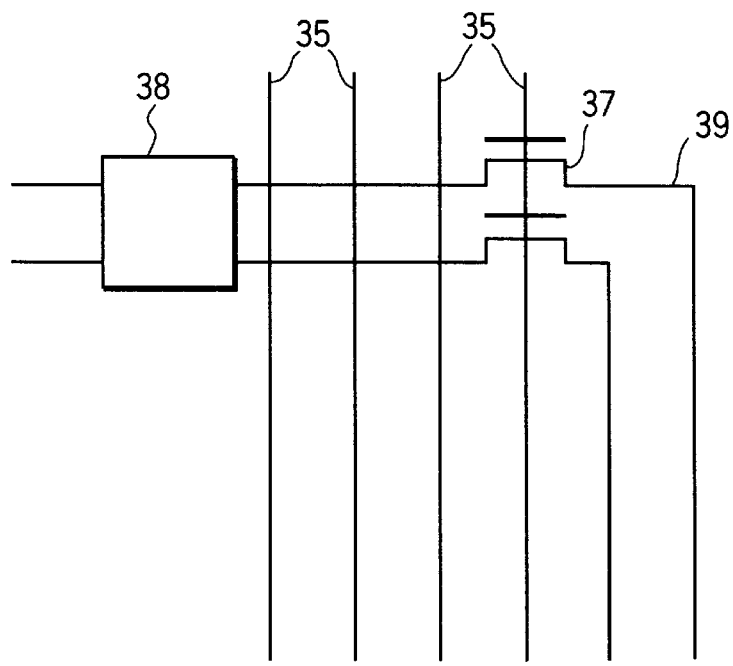
FIG. 6 is an enlarged circuit diagram showing section Z shown in FIG. 5.
Figure 7:
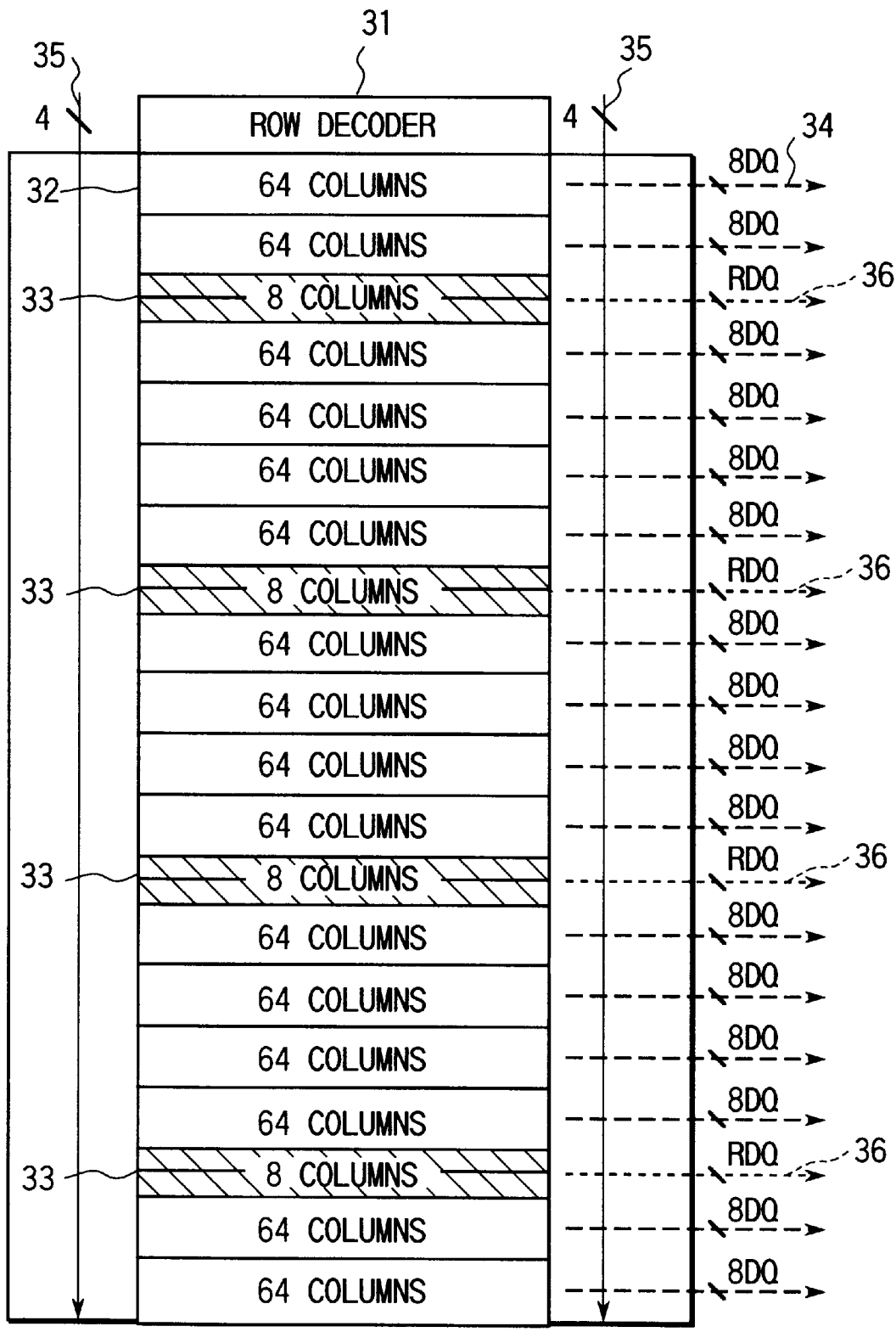
FIG. 7 is a block diagram showing the structure formed when the number of the defect relieving redundant memory-cells is increased in the conventional semiconductor storage apparatus shown in FIG. 4.

The memory-cell section 54 is formed similarly to that shown in FIG. 3. Thus, the memory-cell is connected to the first data line 52 through a FET 24, which is an example of a transfer gate which is controlled by the word line 53.

In the semiconductor storage apparatus, a plurality of memory-cells are disposed into an array configuration. The first data lines 52 are connected to second data lines (DQ and RDQ) 51 through a transfer gate 56, for example, a FET, which is controlled by a column selection line 55 through a sense amplifier (S/A) 50. In this case, the pair of the second data lines (DQ and RDQ) 51 are shared by 8 columns which are physically adjacent to each other.

Reference numeral 57 represents a regular memory-cell block, and 58 represents a defect relieving redundant memory-cell block.

At least two defects D3 and D4 generated in the plurality of the memory-cell blocks 57 in the regular memory-cell group are detected and the group of the memory-cell block divided by grouping in which the defects have been generated is detected.

In accordance with the addresses of the defective columns in which the defect D3 has been generated in the two or more memory-cell blocks 57 in the regular memory-cell block group each having the line DQ, grouping is performed in such a way that the defect D3 belongs to the group B of the memory-cell groups and defect D4 belongs to the group A.

In accordance with the result of grouping of the plurality of the regular memory-cell blocks 57 in the regular memory-cell block group, the plurality of the memory-cell blocks in the defect relieving redundant memory-cell block group are grouped into sections.

The memory-cell group A in the defect relieving unit in the defect relieving redundant memory-cell block 58 which has been grouped is substituted for the group A in the regular memory-cell block group in which changed grouping has been performed and which includes the defect D4. Moreover, the memory-cell group B in the defect relieving unit is substituted for the group B in the regular memory-cell block in which changed grouping has been performed and which includes the defect D3.

As described above, in accordance with changed grouping of the plural regular memory-cell blocks 57 in the regular memory-cell block group, arbitrary division to the group A and group B in the plural memory-cell blocks in the defect relieving redundant memory-cell block group is permitted. Thus, even if the defects D3 and D4 are generated in the regions respectively belonging to the group A in the second data line (DQ) 51 independently from the regular memory-cell block 57, the group B of the defect relieving redundant memory-cell block 58 can be substituted for the defect D3. Moreover, the group A of the defect relieving redundant memory-cell block 58 can be substituted for the defect D4.

Figure 13:
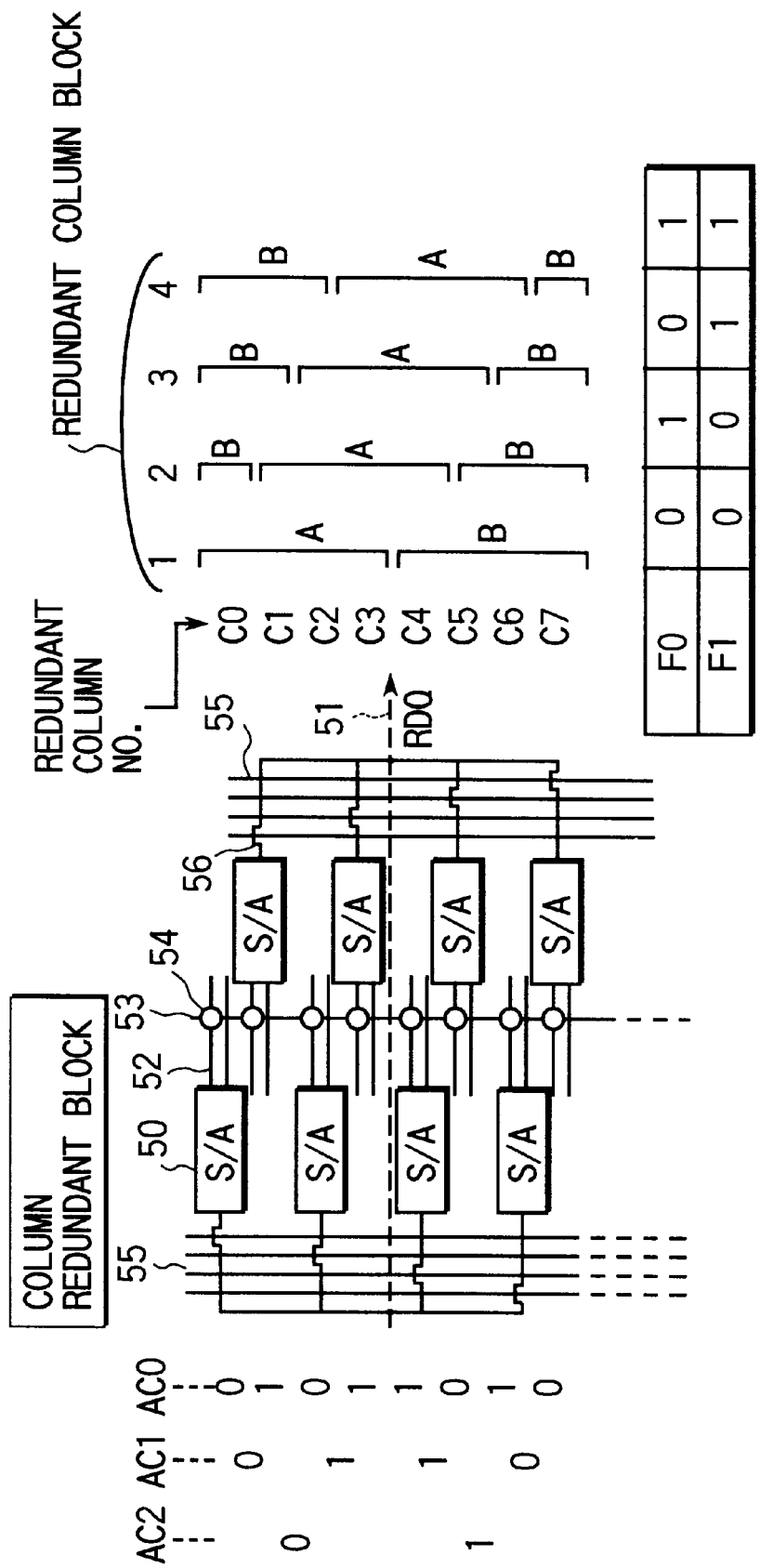
FIG. 13 is a diagram showing the types of grouping of the defect relieving redundant memory-cell group of the semiconductor storage apparatus according to the present invention and column addresses of redundant column blocks corresponding to the redundant column numbers.

FIG. 13 shows an example of four types of defect relieving redundant memory-cell blocks shown in FIG. 12.

The operation for grouping the defect relieving redundant memory-cell block into four types is performed by using a control circuit shown in FIG. 13 for substituting the grouped defect relieving redundant memory-cell blocks for the regular memory-cell block including a defect.

Figure 14:
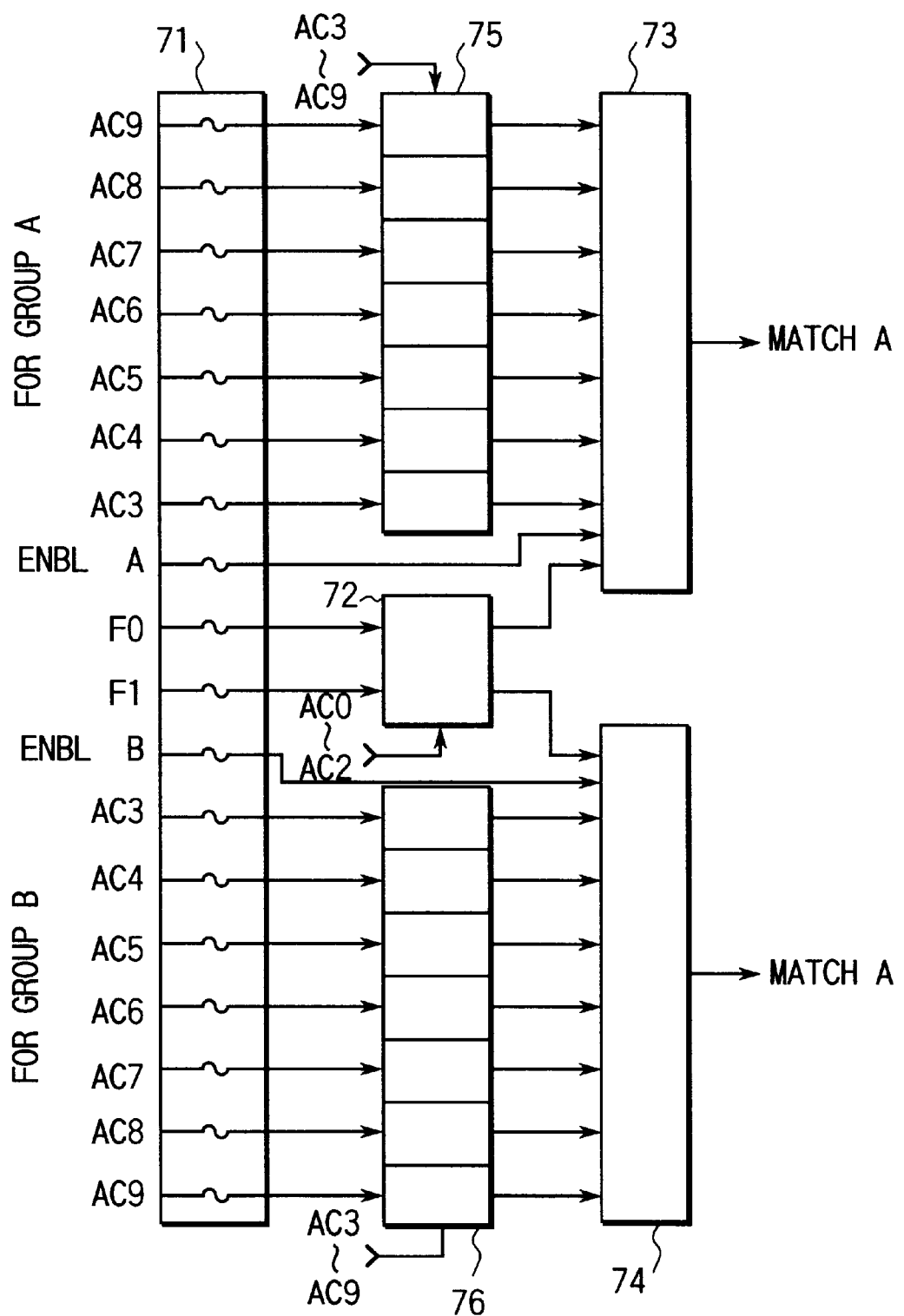
FIG. 14 is a block diagram showing another example of the control circuit for substituting the defect relieving redundant memory-cell block of the semiconductor storage apparatus according to the present invention for a regular memory-cell block having a defect.

Assuming that the number of columns of the defect relieving redundant memory-cell block which are adjacent physically are made to be C0, C1, C2, C3, C4, C5, C6 and C7, grouping type 1 has the group A having column numbers C0 to C3 and the group B having column numbers C4 to C7. At this time, group fuse F0 shown in FIG. 14 is "0" and group fuse F1 is "0".

Grouping type 2 has the group A having column numbers C1 to C4 and the group B having column numbers C0 and C5 to C7. At this time, group fuse device F0 is "1" and group fuse device F1 is "0".

Grouping type 3 has the group A having column numbers C2 to C5 and the group B having column numbers C0, C1, C6 and C7. At this time, group fuse device F0 is "0" and group fuse device F1 is "1".

Grouping type 4 has the group A having column numbers C3 to C6 and the group B having column numbers C0 to C2 and C7. At this time, group fuse device F0 is "1" and group fuse device F1 is "1".

Column address AC0 is made to be "0", "1", "0", "1", "1", "0", "1" and "0" corresponding to column numbers "C0", "C1", "C2", "C3", "C4", "C5", "C6" and "C7".

Column address AC1 is made to be "0", "1", "1", "0" corresponding to column numbers "C0, C1", "C2, C3", "C4, C5", "C6, C7".

Column address AC2 is made to be "0" and "1" corresponding to column numbers "C0, C1, C2, C3" and "C4, C5, C6, C7".

The control circuit shown in FIG. 14 and structured to substitute grouped defect relieving redundant memory-cell blocks for the regular memory-cell blocks including defects stores the column address of the defect D4 generated in the regular memory-cell block 57 in the portion of the fuse block 71 for the group A.

The column address of the defect D3 generated in the regular memory-cell block 57 is stored in the fuse block 71 for the group B.

The fuse block 71 is provided with group fuse devices F0 and F1 capable of arbitrarily setting grouping types 1 to 4, fuse devices AC3 to AC9 for subjecting the columns addresses for the groups A and B to a comparison and enable fuse devices ENBL A and B.

The fuse devices F0, F1, AC3 to AC9, ENBL A and ENBL B output "0" (low voltage level "L") if the fuse is not turned off and outputs "1" (high voltage level "H") if the fuse is turned off. This circuit is formed similarly to that shown in FIG. 10A.

That is, to store the column address of the defect D3 generated in the regular memory-cell block 57 in the fuse block 71 for the group B, the enable fuse device ENBL B for the group B is blown and the fuse devices AC3 to AC9 for the group B are not turned off or turned off.

To store the column address of the defect D4 generated in the regular memory-cell block 57 in the fuse block 71 for the group A, the enable fuse device ENBL A for the group A is turned off and the fuse devices AC3 to AC9 for the group A are not turned off or turned off.

The group fuse devices F0 and F1 are not turned off or turned off to perform predetermined grouping into grouping types 1 to 4. The outputs from the group fuse devices F0 and F1 are supplied to a circuit 72 composed of a group dividing decoding circuit and an address comparison circuit and arranged to detect grouping. The circuit 72 for detecting grouping is supplied with column addresses AC0 to AC2.

The output from the circuit 72 for detecting grouping is supplied to the logical product circuits 73 and 74 for the groups A and B. The outputs from the fuse devices AC3 to AC9 are correspondingly supplied to address bit comparators 75 and 76 for the groups A and B. The address bit comparators 75 and 76 are correspondingly supplied with column addresses AC3 to AC9.

The address bit comparators 75 and 76 output "H" only when both of the inputs from the fuse devices AC3 to AC9 and the inputs from the column addresses AC3 to AC9 are "H" or "L". In the other cases, "L" is output.

The address bit comparators 75 and 76 may be Exclusive NOR circuits. In the address bit comparators 75 and 76, the outputs from the fuse devices AC3 to AC9 for the groups A and B and the column addresses AC3 to AC9 are correspondingly subjected to comparisons.

The outputs from the address bit comparators 75 and 76 and the enable fuse device ENBL A and ENBL B are correspondingly supplied to the logical product circuits 73 and 74. The logical product circuit 73 outputs Match A when all of the inputs from the address bit comparator 75, the enable fuse device ENBL A and the circuit 72 for detecting grouping are "H". When Match A has been output, the corresponding group of the memory-cell relieving unit of the redundant block may be substituted for the column address of the defect D1 generated in the regular memory-cell block 57.

When all of the inputs from the address bit comparator 76, the enable fuse device ENBL B and the circuit 72 for detecting grouping are "H", the logical product circuit 74 outputs Match B. When Match B has been output, the corresponding group of the memory-cell relieving unit of the redundant block may be substituted for the column address of the defect D2 generated in the regular memory-cell block 57.

Figure 15:
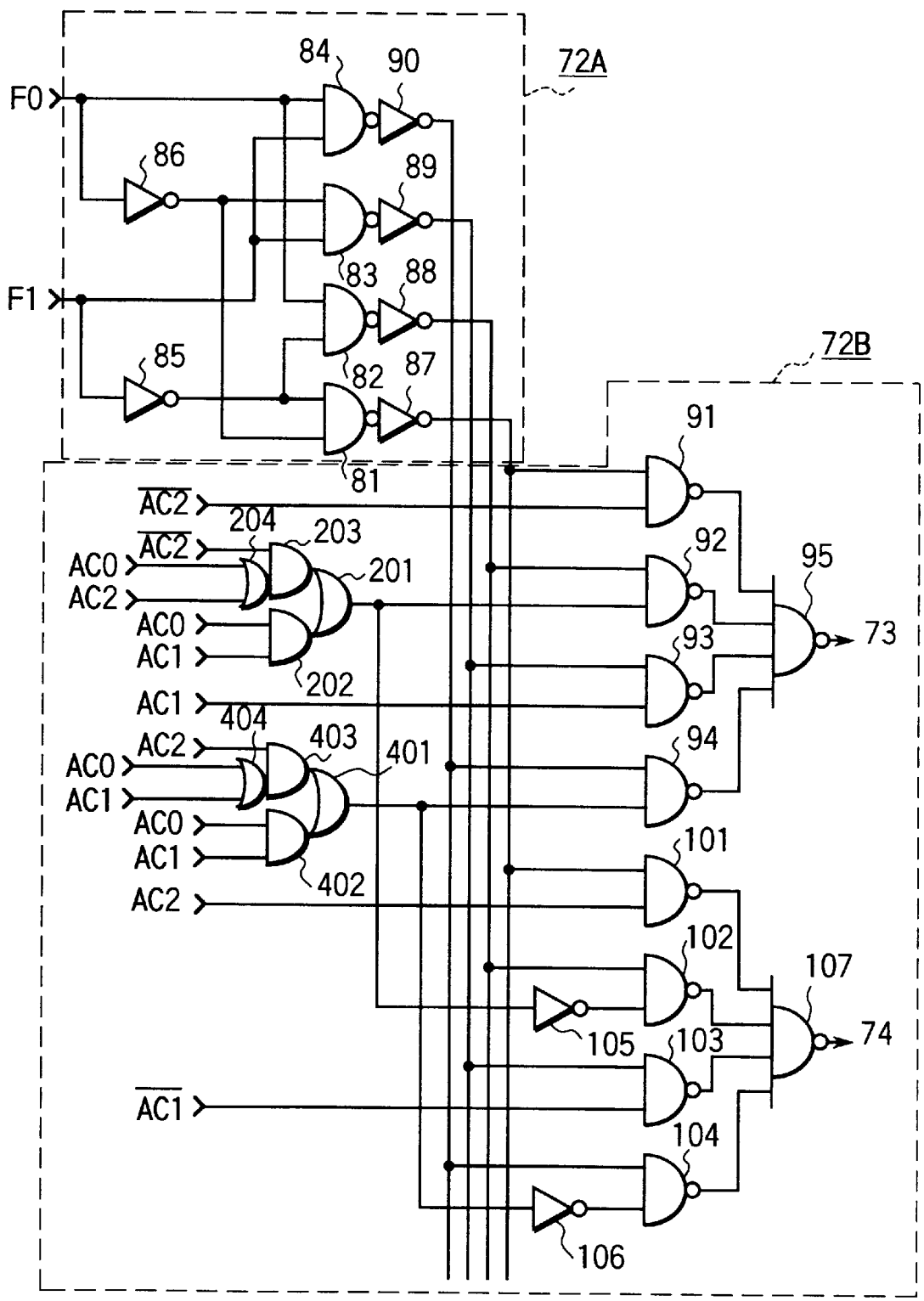
FIG. 15 is a circuit diagram showing an example of the grouping detection circuit shown in FIG. 14.

FIG. 15 is a circuit diagram showing an example of the circuit for detecting grouping. That is, the column addresses AC2 to AC0 as shown in FIG. 13 and the grouping signal stored in the group fuse devices F0 and F1 are subjected comparisons.

An output terminal of the group fuse device F0 is connected to one of input terminals of a NAND circuit 82, one of input terminals of a NAND circuit 84 and an input terminal of an inverter 86.

An output terminal of the inverter 86 is connected to one of input terminals of a NAND circuit 81 and one of input terminals of a NAND circuit 83. An output terminal of the group fuse device F1 is connected to another input terminal of the NAND circuit 83, another input terminal of the NAND circuit 84 and an input terminal of an inverter 85.

An output terminal of the inverter 85 is connected to another input terminal of the NAND circuit 81 and another input terminal of the NAND circuit 82. An output terminal of the NAND circuit 81 is, through an inverter 87, connected to one of input terminals of a NAND circuit 91 and one of input terminals of a NAND circuit 101.

An output terminal of the NAND circuit 82 is, through an inverter 88, connected to one of input terminals of a NAND circuit 92 and one of input terminals of a NAND circuit 102.

An output terminal of the NAND circuit 83 is, through an inverter 89, connected to one of input terminals of a NAND circuit 93 and one of input terminals of a NAND circuit 103.

An output terminal of the NAND circuit 84 is, through an inverter 90, connected to one of input terminals of a NAND circuit 94 and one of input terminals of a NAND circuit 104. Another input terminal of the NAND circuit 91 is supplied with column address $\overline{AC2}$.

An output terminal of an OR circuit 201 is connected to another input terminal of the NAND circuit 92. An output terminal of an AND circuit 202 is connected to one of input terminals of the OR circuit 201.

An input terminal of the AND circuit 202 is supplied with column addresses AC0 and AC1. An output terminal of an AND circuit 203 is connected to another input terminal of the OR circuit 201.

An output terminal of an OR circuit 204 is connected to one of input terminals of the AND circuit 203. An input terminal of the OR circuit 204 is supplied with column addresses AC0 and AC2. Another input terminal of the AND circuit 203 is supplied with column address $\overline{AC2}$. Another input terminal of the NAND circuit 93 is supplied with column address AC1. An output terminal of an OR circuit 401 is connected to another input terminal of the NAND circuit 94. An output terminal of an AND circuit 402 is connected to one of input terminals of the OR circuit 401. An input terminal of the AND circuit 402 is supplied with column addresses AC0 and AC1.

An output terminal of an AND circuit 403 is connected to another input terminal of the OR circuit 401. An output terminal of an OR circuit 404 is connected to one of input terminals of the AND circuit 403. The input terminal of the OR circuit 404 is supplied with column addresses AC0 and AC1. Another input terminal of the AND circuit 403 is supplied with column address AC2.

Another input terminal of the NAND circuit 101 is supplied with column address AC2. An output terminal of an inverter 105 is connected to another input terminal of the NAND circuit 102. An output terminal of the OR circuit 201 is connected to an input terminal of the inverter 105.

Another input terminal of the NAND circuit 103 is supplied with column address $\overline{AC1}$. An output terminal of an inverter 106 is connected to another input terminal of the NAND circuit 104. An output terminal of the OR circuit 401 is connected to an input terminal of the inverter 106.

Output terminals of NAND circuits 91 to 94 are connected to an input terminal of the NAND circuit 95. An output terminal of the NAND circuit 95 is supplied to the logical product circuit 73 for the group A.

Output terminals of the NAND circuits 101 to 104 are connected to an input terminal of the NAND circuit 107. An output from the NAND circuit 107 is supplied with the logical product circuit 74 for the group B.

The NAND circuits 81 to 84 and the inverters 85 to 90 form a group division decoding circuit.

The NAND circuits 91 to 94, 95 and 107, inverters 105 and 106, OR circuits 201, 204, 401 and 404 and the AND circuits 202, 203, 402 and 403 form a address comparison circuit.

That is, when group fuse device F0 is "0", F0 is "L", group fuse device F1 is "0" and F1 is "L", only either of the input terminals of the NAND circuit 91 and NAND circuit 101 is made to be "H". Thus, grouping type 1 is selected.

In this case, only the other input terminal of the NAND circuit 91 is made to be "H" when the column address AC2 is "0" and $\overline{AC2}$ is "H". Thus, "H" is supplied from the NAND circuit 95 to the logical product circuit 73 for the group A.

When the column address AC2 is "1" and AC2 is "H", only the other input terminal of the NAND circuit 101 is made to be "H". Thus, "H" is supplied from the NAND circuit 107 to the logical product circuit 74 for the group B.

When the group fuse device F0 is "1", F0 is "H", group fuse device F1 is "0" and F1 is "L", only either of the input terminals of the NAND circuits 92 and 102 is made to be "H". Thus, grouping type 2 is selected.

If both of the column addresses AC0 and AC1 are "1" and "H", the output from the AND circuit 202 is made to be "H" and the output from the OR circuit 201 is made to be "H". Thus, only the other input terminal of the NAND circuit 92 is made to be "H". Thus, "H" is supplied from the NAND circuit 95 to the logical product circuit 73 for the group A.

When only either of the column address AC0 or AC1 is "1" and "H", the output from the OR circuit 204 is made to be "H". Therefore, if the column address AC2 is "0" and AC2 is "H", the output from the AND circuit 203 is made to be "H" and the output from the OR circuit 201 is made to be "H". Thus, only the other input terminal of the NAND circuit 92 is made to be "H". As a result, "H" is supplied from the NAND circuit 95 to the logical product circuit 73 for the group A.

If both of the column addresses AC0 and AC1 are "0" and "L", the output from the AND circuit 202 is made to be "L", the output from the OR circuit 204 is made to be "L", the output from the AND circuit 203 is made to be "L" and the output from the OR circuit 201 is made to be "L". Thus, only the other input terminal of the NAND circuit 102 is made to be "H". As a result, "H" is supplied from the NAND circuit 107 to the logical product circuit 74 for the group B.

Even if only either column address AC0 or AC1 is "1" and "H", the output from the AND circuit 203 is made to be "L" and the output from the OR circuit 201 is made to be "L" in a case where the column address AC2 is "1" and $\overline{AC2}$ is "L". Thus, only the other input terminal of the NAND circuit 102 is made to be "H". Thus, "H" is supplied from the NAND circuit 107 to the logical product circuit 74 for the group B.

If the group fuse device F0 is "0", F0 is "L", the group fuse device F1 is "1" and F1 is "H", only either of the input terminal of the NAND circuit 93 and NAND circuit 103 is made to be "H". As a result, grouping type 3 is selected.

If the column address AC1 is "1" and "H" in this case, only the other input terminal of the NAND circuit 93 is made to be "H". Thus, "H" is supplied from the NAND circuit 95 to the logical product circuit 73 for the group A. If column address AC1 is "0" and $\overline{AC1}$ is "H", only the other input terminal of the NAND circuit 103 is made to be "H". Thus, "H" is supplied from the NAND circuit 107 to the logical product circuit 74 for the group B.

If the group fuse device F0 is "1", F0 is "H", the group fuse device F1 is "1" and F1 is "H", only either of the input terminals of the NAND circuits 94 and 104 is made to be "H". Thus, grouping type 4 is selected.

If both of the column addresses AC0 and AC1 are "1" and "H" in this case, the output from the AND circuit 402 is made to be "H" and the output from the OR circuit 401 is made to be "H". Thus, only the other input terminal of the NAND circuit 94 is made to be "H". As a result, "H" is supplied from the NAND circuit 95 to the logical product circuit 73 for the group A.

If only either of the column address AC0 or AC1 is "1" and "H", the output from the OR circuit 404 is made to be "H". Therefore, if the column address AC2 is "1" and "H", the output from the AND circuit 403 is made to be "H" and the output from the OR circuit 401 is made to be "H". Thus, only the other input terminal of the NAND circuit 94 is made to be "H". Therefore, "H" is supplied from the NAND circuit 95 to the logical product circuit 73 for the group A.

If both of the column addresses AC0 and AC1 are "0" and "L", the output from the AND circuit 402 is made to be "L", the output from the OR circuit 404 is made to be "L", the output from the AND circuit 403 is made to be "L" and the output from the OR circuit 401 is made to be "L". Thus, only the other input terminal of the NAND circuit 104 is made to be "H". Therefore, "H" is supplied from the NAND circuit 107 to the logical product circuit 74 for the group B.

Even if only either the column address AC0 or AC1 is "1" and "H", the output from the AND circuit 403 is made to be "L" and the output from the OR circuit 401 is made to be "L" in a case where the column address AC2 is "0" and "L". Therefore, "H" is supplied from the NAND circuit 107 to the logical product circuit 74 for the group B.

As described above, this embodiment is structured in such a manner that grouping can be changed by using the fuse devices.

If, for example, two defects are generated in regions belonging to the group A, the structure of the embodiment shown in FIG. 11 cannot substitute, for example, the group A which is one relieving redundant column unit cannot be substituted for the defects. The reason for this is that the division of the group is fixedly performed. Accordingly, arbitrary division is realized by using the fuse devices.

As shown in FIG. 13, two fuse devices (the group fuse devices F0 and F1) are employed to be capable of set four types of division methods. As a result, one redundant column relieving unit can be substituted for the defect which cannot be relieved by the structure shown in FIG. 11, as shown in FIG. 12.

A grouping detection circuit 72 shown in FIG. 14 is composed of a grouping division circuit 72A and an address comparison circuit 72B.

The grouping division circuit 72A decodes outputs from two fuse devices.

The address comparison circuit 72B is composed of a circuit for subjecting a decoded output from the grouping division circuit 72A and addresses AC0 to AC2 supplied from outside to comparisons. The foregoing circuit determines the group to which the address which is being supplied from outside of the chip belongs. Specifically, the circuit decodes the grouping fuse device to determine the type of grouping which is performed by the column relieving unit.

Then, the identified signals are subjected to comparisons with identification signals for the groups by using addresses CA0 and CA1 supplied from outside.

Figure 16:
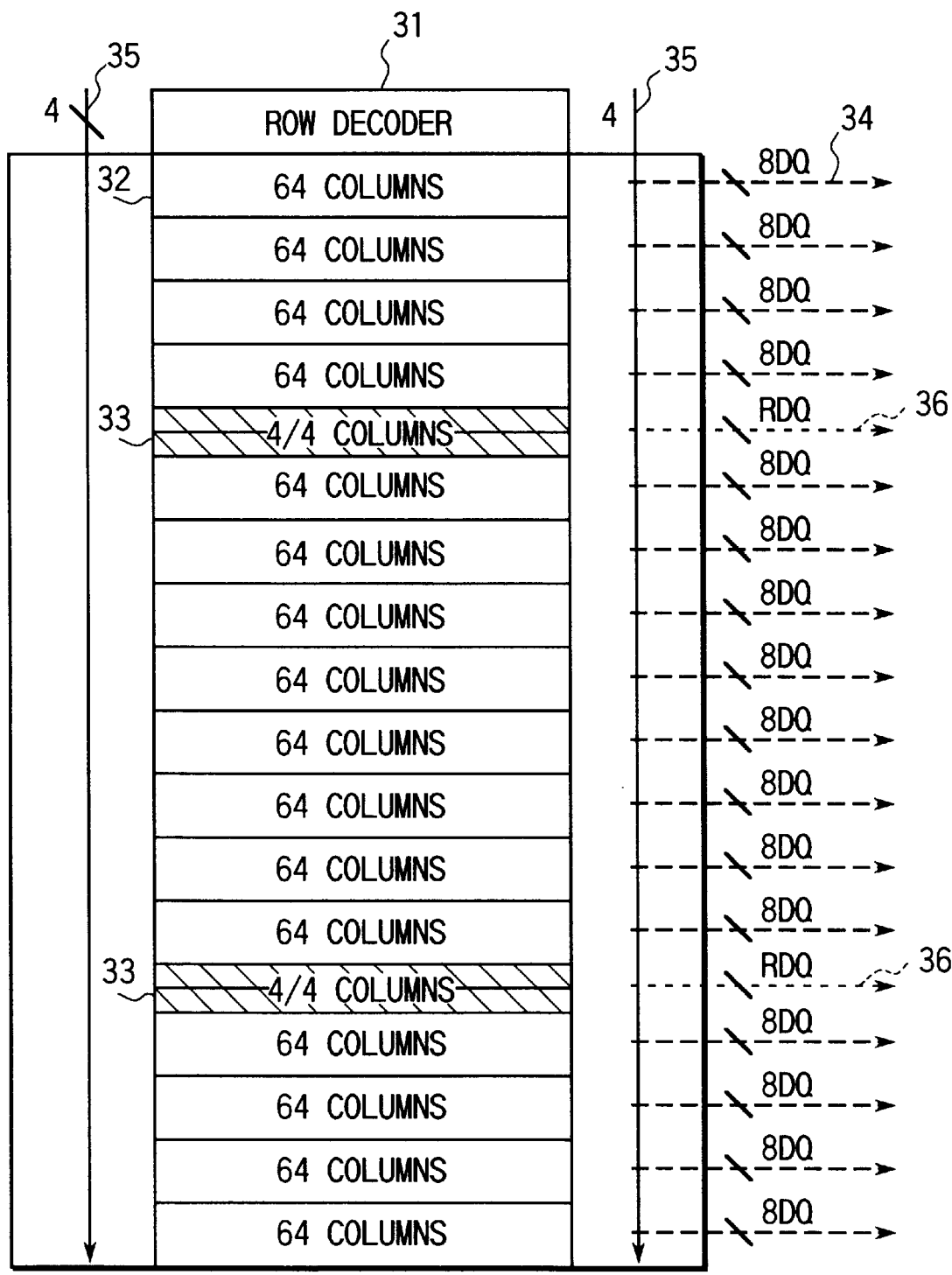
FIG. 16 is a block diagram showing the structure of the semiconductor storage apparatus according to the present invention.

FIG. 16 is an overall schematic diagram showing an array group to this embodiment.

Another embodiment of the means of replacing the new divided redundant memory-cell blocks to the corresponding memory-cell blocks which includes the defect is not specifically described. However, in receipt of the Match A or the Match B as shown in FIG. 10A or FIG. 14, any circuit which can switch the passing of data from data line DQ to data line RDQ may be used.

Although the division of the column relieving unit is, in this embodiment, divided into two sections, the present invention is not limited to this. The unit may be divided into a larger number of units. In this case, the number of defects which can be relieved can be increased. Above mentioned control circuit as shown in FIG. 10A and the grouping detection circuit as shown in FIG. 15 are not limited in these embodiment. Any circuit which has a same controlling function of the control circuit and a same detecting function of the grouping detection circuit may be used. The present invention is effectively applied to a DRAM, a SRAM, a nonvolatile memory and a logic embedded memory. In particular, a further effective defect relieving method can be obtained when the present invention is applied to the logic embedded memory because the data band widths in a logic portion and a memory portion are enlarged.

Above mentioned embodiment, the memory-cell block is constituted by 8 columns. However, it is not limited to 8 columns and may be used in 4 columns or 16 columns.

Figure 17:
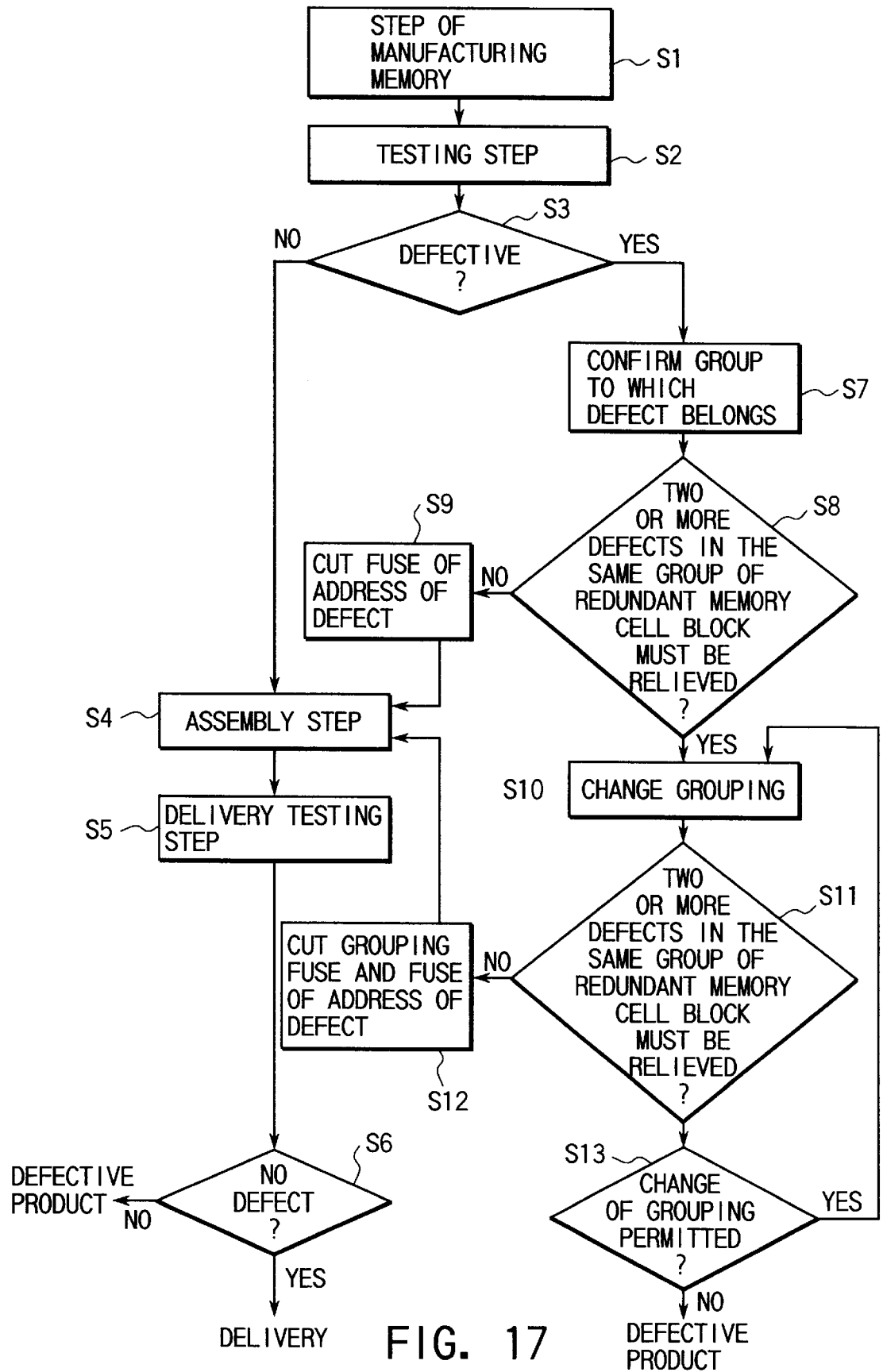
FIG. 17 is a flow chart showing a process for manufacturing the semiconductor storage apparatus according to the present invention.

A method of manufacturing the semiconductor storage apparatus according to the present invention will now be described with reference to FIG. 17.

A memory manufacturing step (S1) is performed, and then a testing step (S2) is started. Whether or not a regular memory-cell block has a defect is determined (S3). If no defect is detected, an assembly step is performed (S4). Then, a delivery testing step (S5) is performed to determine whether or a defect exist (S6). If no detect exists, the product is delivered. If a defect is detected, the product is omitted as a defective product.

If a determination is performed that the regular memory-cell block has a defect, the group in the memory-cell block in which the defect has been generated in a data line in a plurality of memory-cell blocks in the regular memory-cell block group is detected (S7).

Whether or not two or more defects in the same group in a memory-cell block in the defect relieving redundant memory-cell block group must be relieved is determined (S8). If one defect is required to be relieved by one group of the redundant memory-cell block, the fuse of the defective address is cut (S9). Thus, the same group of the redundant memory-cell block is substituted for the defective block.

Then, the assembly step (S4) is performed.

If one group of the redundant memory-cell block must relieve two or more defects (S8), grouping of the memory-cell group is changed in accordance with the address of the defective columns in the two or more memory-cell blocks in the regular memory-cell block group (S10).

In accordance with changed grouping of the defective blocks, whether or not the same group in the defect relieving redundant memory-cell block must relieve two or more defects is determined (S11). If two or more defects are not required to be relieved, the grouping fuse and the fuse for the defective address are cut (S12). Thus, the same group of the redundant memory-cell block can be substituted for the defective block. Then, the assembly step (S4) is performed.

If the same group of the defect relieving redundant memory-cell block must relieve two or more defects (S11), whether or not grouping can be performed is determined (S13). If grouping cannot be performed, the product is omitted as a defective product. If grouping can be performed, the operation returns to step (S10) so that the grouping of the defect relieving redundant memory-cell block is changed. Then, the group is substituted for the group including the defect in accordance with changed grouping of the defective block.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage apparatus comprising:
    a plurality of memory-cells arranged in an array and composed of regular memory-cell blocks and redundant memory-cell blocks;
    a regular DQ line shared by physically adjacent columns for each of a plurality of memory cells in each of the regular memory-cell blocks, and a redundant DQ line shared by physically adjacent columns for each of a plurality of memory cells in each of the redundant memory-cell blocks, the plural memory-cell groups being grouped into at least two groups sharing said each DQ line;
    means for storing the addresses of columns in which the defects have been generated in the regular memory-cell blocks when at least two defects were detected in data lines of a plurality of regular memory cell-blocks;
    means for grouping the redundant memory-cell blocks into groups in accordance with the changed groups corresponding to the addresses of the defective column in the data lines in the regular memory-cell blocks which share the DQ lines; and
    means for substituting the changed grouping portions of the redundant memory-cell blocks for the corresponding regular memory-cell blocks in which includes the defect.

2. A semiconductor storage apparatus according to claim 1, wherein
    said plural memory-cells are connected to a first data line through transfer gates controlled by a word line, and said DQ lines are formed in the direction of said first data line so that an overlaid structure is formed on said memory-cell array.

3. A semiconductor storage apparatus according to claim 1, wherein
    said means for grouping has a circuit composed of a group division decoder circuit and an address comparison circuit and arranged to detect grouping, wherein the type of grouping is stored in at least one fuse device.

4. A semiconductor storage apparatus according to claim 1, wherein
    each of said regular memory-cell blocks and said redundant memory-cell blocks consists of eight columns, and
    the addresses of the columns of the redundant memory-cell blocks are determined in such a manner that assuming that group A has columns given numbers C0 to C3 and group B has columns given numbers C4 to C7 and sharing the DQ line, column address AC0 is 0, 1, 0, 1, 1, 0, 1 and 0 to correspond to column numbers C0, C1, C2, C3, C4, C5, C6 and C7, column address AC1 is 0, 1, 1 and 0 to correspond to column numbers "C0, C1", "C2, C3", "C4, C5", and "C6, C7" and column address AC2 is 0 and 1 to correspond to column numbers "C0, C1, C2 and C3" and "C4, C5, C6 and C7".

5. A method of manufacturing a semiconductor storage apparatus comprising the steps of:
    preparing a plurality of memory-cells having a regular memory-cell block group and a defect relieving redundant memory-cell block group, each group disposed in an array configuration, a DQ line shared by a plurality of memory-cells in said regular memory-cell block group and a plurality of memory-cells in said redundant memory-cell block group, the plural memory-cell blocks in said regular memory-cell block group being divided into at least two memory-cell groups sharing said one DQ line;
    detecting at least two defects generated in data lines of a plurality of memory-cell blocks of said regular memory-cell block group to confirm groups in said grouped memory-cell block to which the defects respectively belong;
    changing grouping of the memory-cell group in accordance with the addresses of defective columns in said memory-cell block in which the defects have been generated in at least two memory-cell blocks in said regular memory-cell block group which respectively share said DQ line;
    grouping said plurality of memory-cell blocks of said defect relieving redundant memory-cell block group in accordance with changed grouping performed in said step of changing grouping of the plurality of memory cell blocks in said regular memory-cell block group; and
    substituting grouped defect relieving unit memory-cell groups in said defect relieving redundant memory-cell block groups for said group in said regular memory-cell block group in which changed grouping has been performed and which includes the defects.

6. A semiconductor storage apparatus comprising:
    a plurality of memory-cells arranged, forming array which is composed of regular memory-cell blocks and redundant memory-cell blocks;
    a regular DQ line shared by physically adjacent columns for each of a plurality of memory cells in each of the regular memory-cell blocks, and a redundant DQ line shared by physically adjacent columns for each of a plurality of memory cells in each of the redundant memory-cell blocks, the plural memory-cell groups being grouped into at least two groups sharing said each DQ line;
    a memory for storing the addresses of columns in which the defects have been generated in the regular memory-cell blocks when at least two defects were detected in data lines of a plurality of regular memory cell-blocks;

a circuit comprising a grouping division circuit and an address comparison circuit and for grouping the redundant memory cell-blocks into groups in accordance with the changed groups corresponding to the addresses of the defective column in the data lines in the regular memory-cell blocks which share the DQ lines; and a circuit for substituting the changed grouping portions of the redundant memory-cell blocks for the corresponding regular memory-cell blocks in which includes the defect.

7. A semiconductor storage apparatus according to claim 6, wherein said plural memory-cells are connected to a first data line through transfer gates which are controlled by a word line, and said DQ line are formed in the direction of said first data line so that an overlaid structure is formed on said memory-cell array.

8. A semiconductor storage apparatus according to claim 6, wherein said means for grouping has a circuit composed of a group division decoder circuit and an address comparison circuit and arranged to detect grouping, and the type of grouping is stored in at least one fuse device.

9. A semiconductor storage apparatus according to claim 6, wherein each of said regular memory-cell blocks and said redundant memory-cell blocks consists of eight columns, and the addresses of the columns of the redundant memory-cell blocks are determined in such a manner that assuming that group A has columns given numbers C0 to C3 and group B has columns given numbers C4 to C7 and sharing the DQ line, column address AC0 is 0, 1, 0, 1, 1, 0, 1 and 0 to correspond to column numbers C0, C1, C2, C3, C4, C5, C6 and C7, column address AC1 is 0, 1, 1 and 0 to correspond to column numbers "C0, C1", "C2, C3", "C4, C5", and "C6, C7" and column address AC2 is 0 and 1 to correspond to column numbers "C0, C1, C2 and C3" and "C4, C5, C6 and C7".

* * * * *

UNITED STATES PATENT AND TRADEMARK OFFICE
CERTIFICATE OF CORRECTION

PATENT NO : 6,097,643
DATED : August 1, 2000
INVENTOR(S): Takehiro HASEGAWA

It is certified that error appears in the above-identified patent and that said Letters Patent are hereby corrected as shown below:

Col. 1, line 73, change "Toshiba Corporation" to --KABUSHIKI KAISHA TOSHIBA--.

Signed and Sealed this

Twenty-fourth Day of April, 2001

*Attest:*

NICHOLAS P. GODICI

*Attesting Officer*  *Acting Director of the United States Patent and Trademark Office*